US009692385B2

United States Patent
Okada et al.

(10) Patent No.: US 9,692,385 B2
(45) Date of Patent: Jun. 27, 2017

(54) NOISE REDUCTION DEVICE

(71) Applicant: KITAGAWA INDUSTRIES CO., LTD., Inazawa-shi, Aichi-ken (JP)

(72) Inventors: Yuya Okada, Nagoya (JP); Kazushige Ueno, Gifu (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 0 days.

(21) Appl. No.: 15/254,430

(22) Filed: Sep. 1, 2016

(65) Prior Publication Data

US 2017/0093357 A1    Mar. 30, 2017

(30) Foreign Application Priority Data

Sep. 29, 2015  (JP) ................. 2015-191280

(51) Int. Cl.
*H05K 9/00* (2006.01)
*H03H 1/00* (2006.01)
(Continued)

(52) U.S. Cl.
CPC ............ *H03H 1/00* (2013.01); *H03H 7/0115* (2013.01); *H05K 1/181* (2013.01); *H05K 5/0213* (2013.01); *H05K 5/04* (2013.01); *H05K 9/0049* (2013.01); *H05K 9/0066* (2013.01); *H05K 9/0071* (2013.01); *H01F 2017/065* (2013.01); *H03H 2001/005* (2013.01); *H03H 2001/0057* (2013.01); *H05K 2201/10015* (2013.01)

(58) Field of Classification Search
CPC ............ H01F 2017/065; H05K 9/0066; H05K 9/0071
See application file for complete search history.

(56) References Cited

U.S. PATENT DOCUMENTS 7,561,008 B2 * 7/2009 Lucas .................... H03H 7/427
                                                                333/181
7,961,065 B2 * 6/2011 Kobayashi ............ H01F 17/045
                                                                333/172

(Continued)

FOREIGN PATENT DOCUMENTS

DE    202013104903 U1    11/2013
JP    2015-057806 A    3/2015

OTHER PUBLICATIONS

Feb. 28, 2017 Extended Search Report issued in European Application Publication No. 16190735.7.

Primary Examiner — Hung V Ngo
(74) Attorney, Agent, or Firm — Oliff PLC

(57) ABSTRACT

Provided is a noise reduction device including: a conductive bar of conductive material; a metal tubular portion with a through hole having the conductive bar penetrating therethrough and accommodating a magnetic material core and a substrate therein; a capacitor mounted on the substrate and having a first terminal connected to the conductive bar and a second terminal connected to an inner wall of the through hole; and a blocking unit blocking an opening of the through hole so as to affix the conductive bar with respect to the metal housing and the tubular portion. The tubular portion includes an outer peripheral surface having a threaded engagement part threadedly engaged with the metal housing; and the conductive bar has an outer end that functions as an output terminal.

17 Claims, 11 Drawing Sheets

(51) Int. Cl.
*H05K 5/02* (2006.01)
*H05K 1/18* (2006.01)
*H05K 5/04* (2006.01)
*H03H 7/01* (2006.01)
H01F 17/06 (2006.01)

(56) References Cited

U.S. PATENT DOCUMENTS

| | | | | |
|---|---|---|---|---|
| 7,961,071 | B2* | 6/2011 | Earle | H01F 37/00 |
| | | | | 336/138 |
| 8,712,544 | B2* | 4/2014 | Dabney | A61N 1/08 |
| | | | | 607/116 |
| 8,929,048 | B2* | 1/2015 | Smugala | H01F 17/062 |
| | | | | 361/117 |
| 9,117,587 | B2* | 8/2015 | Nagata | H01F 17/06 |
| 9,171,661 | B2* | 10/2015 | Terakawa | H01F 17/06 |
| 9,276,546 | B2* | 3/2016 | Craig | H01F 27/26 |
| 9,331,657 | B2* | 5/2016 | Ohashi | H02G 5/06 |
| 9,331,660 | B2 | 5/2016 | Aizawa | |
| 2006/0137891 | A1* | 6/2006 | Berens | H01F 17/06 |
| | | | | 174/36 |
| 2007/0257759 | A1* | 11/2007 | Lee | H01F 17/062 |
| | | | | 336/90 |
| 2008/0129438 | A1* | 6/2008 | Lee | H01F 1/26 |
| | | | | 336/220 |
| 2014/0233282 | A1 | 8/2014 | Ohoka et al. | |
| 2014/0326499 | A1 | 11/2014 | Ohashi | |
| 2015/0042416 | A1 | 2/2015 | Aizawa | |
| 2015/0372655 | A1* | 12/2015 | Beck | H03H 1/0007 |
| | | | | 333/185 |
| 2016/0148745 | A1 | 5/2016 | Tanimizu et al. | |

* cited by examiner

NOISE REDUCTION DEVICE

CROSS-REFERENCE TO RELATED APPLICATION

This application claims priority from Japanese Patent Application No. 2015-191280 filed with the Japan Patent Office on Sep. 29, 2015, the entire content of which is hereby incorporated by reference.

FIELD

The present disclosure relates to a noise reduction device.

BACKGROUND

In output signals (such as output voltages) output from electronic devices, such as a switching power supply, noise having the same frequency as the operation frequency of the electronic device or harmonic frequencies thereof may be mixed. Because the noise may have an adverse effect on an external electronic device, it is necessary to reduce the noise. For example, a switching power supply outputs an output voltage of a predetermined voltage value by a switching operation of a power transistor. As the current paths are switched by the turning on and off of the power transistor, noise having the switching frequency and harmonic frequencies thereof may be generated. The noise may become superposed on the output voltage and be input into an external electronic device. In order to decrease the noise, a noise reduction device provided with an inductance element, such as a choke coil, may be inserted in an output path for the output voltage (see, for example, JP-A-2015-57806).

In the automotive field, for example, the electronic devices such as the switching power supply described above may be accommodated in a metal housing made of aluminum and the like, from the viewpoint of ensuring reliability in terms of not being affected by the surrounding environment, such as vibrations. For the same purpose of ensuring reliability, it has also been proposed to accommodate the noise reduction device in a metal housing. However, the metal housing does not necessarily ensure that the problems caused by the circuit elements or wiring, such as electromagnetic coupling including capacitive coupling and inductive coupling, and sneak noise from the ground potential, are sufficiently prevented in the housing. Accordingly, a noise caused by the switching operation of a power transistor, for example, may reach the output terminal without passing through the output path of the noise reduction device.

In order to address the problem, a part of the output side of a noise reduction device disclosed in JP-A-2015-57806 is disposed outside the metal housing. The noise reduction device is provided with a choke coil module. The choke coil module is obtained by sealing a member, including a conductive bar inserted into a tubular ferrite core, with thermosetting resin. A flange portion of the choke coil module is disposed on the outside of the metal housing. The flange portion includes a vertical plane with respect to the direction in which the conductive bar extends. The plane is opposed to an outer peripheral surface of the metal housing, and affixed to the metal housing by means of bolts. In the flange portion, a substrate with chip capacitors mounted thereon is sealed with resin. The chip capacitors are connected to a choke coil in the LC filter circuit.

SUMMARY

A noise reduction device according to an embodiment of the present disclosure includes: a conductive bar of conductive material; a magnetic material core of magnetic material disposed at surroundings of the conductive bar; a substrate attached to the conductive bar so as to be adjacent to the magnetic material core; a metal tubular portion with a through hole having the conductive bar penetrating therethrough and accommodating the magnetic material core and the substrate therein; a capacitor mounted on the substrate and having a first terminal connected to the conductive bar and a second terminal connected to an inner wall of the through hole; and a blocking unit blocking an opening of the through hole so as to affix the conductive bar with respect to the metal housing and the tubular portion. The tubular portion includes an outer peripheral surface having a screwed engagement part screwedly engaged with the metal housing; the magnetic material core, the substrate, and the capacitor are disposed in the through hole blocked by the blocking unit; and the conductive bar has an outer end that functions as an output terminal.

The object and advantages of the invention will be realized and attained by means of the elements and combinations particularly pointed out in the claims.

It is to be understood that both the forgoing general description and the following detailed description are exemplary and explanatory and are not restrictive of the invention.

DESCRIPTION OF EMBODIMENTS

Figure 1:
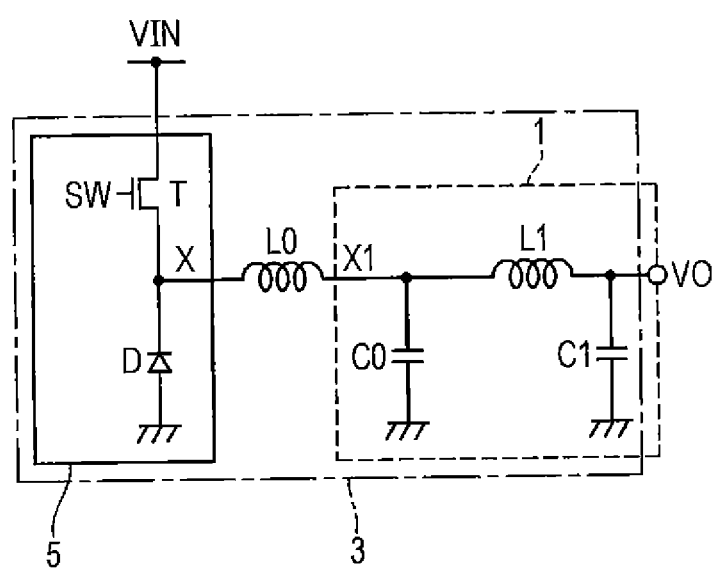
FIG. 1 is a circuit diagram of a filter module as an example of a noise reduction device according to the present embodiment connected to a switching power supply.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The noise reduction device having the above-described configuration includes a conductive bar connected to the substrate and chip capacitors sealed with resin in the flange portion. The substrate is electrically connected to the metal housing by means of bolts. Accordingly, the conductive bar is supplied with ground potential from the metal housing via the substrate with the chip capacitors mounted thereon and the bolts. In this case, the equivalent series inductance (ESL) of the LC filter circuit including the choke coil and chip capacitors increases in accordance with the distance of connection between the chip capacitors and the metal housing. As a result, a decrease in filter performance may be caused.

An object of the present disclosure is to provide a noise reduction device capable of decreasing noise that becomes mixed in an output signal transmitted through a conductive bar. A more specific object of the present disclosure is to provide a noise reduction device that can decrease both noise caused by the operation of an electronic device accommodated in a metal housing and the ESL, by adopting a specific arrangement of capacitors included in a filter circuit.

A noise reduction device according to the embodiment of the present disclosure decreases the noise that becomes mixed in an output signal from an electronic device accommodated in a metal housing. The noise reduction device includes a conductive bar, a magnetic material core, a substrate, a tubular portion, a capacitor, and a blocking unit. The conductive bar is made of conductive material and transmits the output signal. The magnetic material core made of magnetic material is disposed at surroundings of the conductive bar. The substrate is attached to the conductive bar so as to be adjacent to the magnetic material core. The tubular portion may be formed from a metallic material. The tubular portion is a tubular member including a through hole having the conductive bar penetrating therethrough and accommodating the magnetic material core and the substrate. The tubular portion includes an outer peripheral portion having a screwed engagement part screwedly engaged with the metal housing. The capacitor is mounted on the substrate and includes a first terminal and a second terminal. The first terminal is connected to the conductive bar. The second terminal is connected to an inner wall of the through hole. The blocking unit blocks an opening of the through hole while affixing the conductive bar to the metal housing and the tubular portion so as to have an outer end of the conductive bar serve to function as an output terminal. The magnetic material core, the substrate, and the capacitor are disposed in the through hole blocked by the blocking unit.

The tubular portion of the noise reduction device is affixed by screwed engagement with the metal housing. The conductive bar for transmitting the output signal is inserted into the through hole of the tubular portion. The magnetic material core is disposed at surroundings of the conductive bar and functions as a choke coil. The choke coil and the capacitor mounted on the substrate adjacent to the magnetic material core are included in an LC filter circuit. The capacitor is connected to the inner wall of the through hole. Accordingly, ground potential is supplied from the metal housing to the capacitor, via the tubular portion.

In the conventional noise reduction device, the conductive bar is supplied with ground potential from the metal housing via the substrate mounting the capacitor and the bolts. As a result, the ESL may be increased depending on the connecting distance between the capacitor and the metal housing. In contrast, in the present noise reduction device, the terminal of the capacitor connected to the inner wall of the through hole of the tubular portion may not have the intervention of a fastener such as a bolt. As long as the size of the tubular portion is such that the conductive bar, the capacitor and the like can be accommodated therein, the distance between the capacitor and the inner wall can be reduced by decreasing the inner diameter of the through hole. By having the screwed engagement part of the outer peripheral portion of the tubular portion screwedly engaged with the metal housing, a contact area between the tubular portion and the metal housing can be ensured. In this way, a stable supply of ground potential can be ensured. Accordingly, the connecting distance between the capacitor and the metal housing is reduced. As a result, the ESL can be decreased and an increase in filter performance can be achieved. A decrease in ESL enables a decrease in the size of the magnetic material core as an LC filter circuit choke coil. Accordingly, the size of the noise reduction device and metal housing can be reduced.

In addition, in the conventional noise reduction device, the bolts affixing the substrate and the like to the metal housing are disposed outside the metal housing, with the bolts partly exposed. As a result, to the bolts through which ground potential is supplied, liquid produced outside the metal housing may become attached, potentially causing rust and the like and leading to a decrease in conduction of the bolts. Namely, an increase in equivalent series resistance (ESR) may be caused. In contrast, in the present noise reduction device, the through hole accommodating the capacitor, magnetic material core, substrate and the like are blocked by the blocking unit. The blocking unit shields the space inside the through hole from the outside. Accordingly, the attachment of liquid produced outside the metal housing to the circuit elements, such as the capacitor, and to the wiring connecting the circuit elements can be suppressed, thus suppressing a decrease in conduction due to the rust and the like. In addition, in the present noise reduction device, because the capacitor and the like are accommodated in the through hole, there is no need to seal and protect the capacitor and the like as a whole. This leads to a decrease in the amount of resin used for sealing, and an increase in the range of usable resin material. As a result, a decrease in manufacturing cost can be achieved.

If, instead of accommodating the noise reduction device in the through hole, the device as a whole is accommodated in the metal housing on the input side (inside) of the through hole, electromagnetic coupling due to the circuit elements and wiring, such as capacitive coupling and inductive coupling, is created in the noise reduction device. For example, if the electronic device accommodated in the metal housing is a switching power supply, noise caused by the switching operation may be propagated in the circuit elements and the like of the noise reduction device due to electromagnetic coupling. In contrast, in the case of the circuit elements of the present noise reduction device, such as the capacitor and the magnetic material core, a tubular portion having the through hole provides the effect of an electromagnetic shield. Accordingly, the propagation of noise from the switching power supply by electromagnetic coupling is prevented.

The tubular portion of the noise reduction device according to the present application may also include an extension part extending outwardly of the metal housing, and a flange portion protruding from the extension part toward the outside in a diameter direction of the tubular portion. The blocking unit may be formed from a resin material. The extension part and the flange portion may be sealed by the blocking unit.

The blocking unit of the noise reduction device seals and protects the extension part and the flange portion of the tubular portion that are disposed on the outside of the metal housing. The flange portion protrudes toward the outside in the diameter direction of the tubular portion. By applying external force to the blocking unit, frictional force is generated between the blocking unit and the flange portion. As a result, the tubular portion can be provided with rotational torque. Accordingly, the blocking unit can provide the external force as rotational torque to the tubular portion while protecting the extension part and the flange portion.

In the noise reduction device according to the present application, the tubular portion may extend into the metal housing beyond the internally screwed engagement part of the metal housing screwedly engaged with the screwed engagement part of the tubular portion.

The tubular portion extends to a position such that the capacitor and the like mounted on the conductive bar can be accommodated in the through hole. In this way, the capacitor and the like can be protected from electromagnetic coupling. In other words, the length of the portion of the tubular portion extending in the axial direction may be modified in accordance with the position of the capacitor and the like. Meanwhile, with regard to the standard of the screwed engagement part, the number of screws, pitch, size and the like may be determined in accordance with the sufficient strength for affixing the noise reduction device to the metal housing, for example. Accordingly, as long as the sufficient strength can be ensured, it may not be necessary to provide the screwed engagement part of the tubular portion throughout the outer peripheral portion in the axial direction of the tubular portion. In addition, by extending the tubular portion of the noise reduction device in accordance with the position of the capacitor and the like, the capacitor and the like can be protected from noise propagation. Further, by decreasing the size of the screwed engagement part in accordance with the required strength, the size of the other part screwed by the screwed engagement part can be decreased. As a result, the thickness of the metal housing can be reduced.

The noise reduction device according to the present application may include a contact portion. The contact portion may be mounted on the substrate. The contact portion may be held between the substrate and the inner wall of the through hole and elastically deformed with a part of the contact portion contacting the inner wall. In this way, a capacitor terminal is electrically connected to the inner wall.

When the conductive bar of the noise reduction device is inserted into the through hole, the contact portion contacts the inner wall of the through hole. The contact portion contacting the inner wall is elastically deformed, generating rebounding force toward the inner wall of the through hole. This ensures more reliable conduction between the capacitor, the tubular portion, and the metal housing. It also eliminates the need for the work to connect, to the inner wall of the through hole, wiring and the like for supplying ground potential to the capacitor. Accordingly, an increase in work efficiency can be achieved in attaching the noise reduction device to the tubular portion and the metal housing.

According to the present application, the conductive bar of the noise reduction device may have a board-like shape. The substrate may be mounted on a planar portion of the conductive bar. One terminal of the capacitor may be connected to the conductive bar by an electrode affixed to the planar portion of the conductive bar.

In the noise reduction device, the substrate on which the capacitor is mounted may have an electrode directly affixed to the conductive bar. This enables a decrease in ESL and ESR and an increase in filter performance. When the substrate is affixed to the planar portion of the board-like conductive bar, the substrate can be attached to the conductive bar easily.

The noise reduction device according to the present application may have a mold portion of resin material for affixing the position of the magnetic material core with respect to the conductive bar.

By the resin included in the mold portion of the noise reduction device and sealing the conductive bar, the position of the magnetic material core with respect to the conductive bar can be affixed.

According to the present application, the blocking unit of the noise reduction device may include a ventilation hole providing communication between the inside of the through hole and the outside, and a waterproof ventilation member disposed in the ventilation hole and having a gas-transmitting ventilation property and a liquid non-transmitting waterproof property.

According to the noise reduction device, the ventilation hole allows the passage of gas between the inside of the through hole and the outside of the blocking unit, while suppressing the entry of liquid from the outside into the through hole. This ensures a ventilation property between the through hole and the outside, whereby, for example, dew condensation by a humidity increase in the through hole blocked by the blocking unit can be suppressed. Accordingly, the capacitor and the like can be protected from such dew condensation.

In the noise reduction device according to the technology disclosed in the present application, a decrease in noise caused by the operation of the electronic device accommodated in the metal housing and a decrease in ESL can be both achieved.

In the following, an embodiment of the present disclosure will be described with reference to the drawings. FIG. 1 is a circuit diagram including a filter module 1 as an example of the noise reduction device according to the present disclosure. The filter module 1 is connected to a connection point X of a switching power supply 5. The switching power supply 5 is accommodated in an aluminum die-cast metal housing 3, for example.

Referring to FIG. 1, the electrical operation and effect of the filter module 1 will be described. The switching power supply 5 is a vehicle-mounted step-down switching power supply, for example. The switching power supply 5 steps down a power supply voltage VIN (such as DC 244 V) for the drive system that is supplied from a main battery (not illustrated) that a hybrid vehicle or an electric automobile is equipped with to a lower voltage value for power supply to an auxiliary battery (not illustrated). The auxiliary battery supplies a power supply voltage (for example, DC 14 V) to interior electrical components such as audio equipment, air conditioner, and illumination devices.

The switching power supply 5 includes a power transistor T and a diode D that are connected in series between a power supply voltage VIN and a ground potential GND. The switching power supply 5 supplies electric power via a connection point X of the power transistor T and the diode D. The switching power supply 5, based on a switching signal SW applied to the gate terminal of the power transistor T, implements on/off control for the power transistor T at a predetermined switching frequency f.

The filter module 1 is a π-type filter module. The module includes, between an input terminal X1 and an output terminal VO, a capacitor C0, a choke coil L1, and a capacitor C1 that are mutually connected. The choke coil L1 of the filter module 1 is disposed in an output voltage path connecting the input terminal X1 and the output terminal VO. The capacitor C0 is connected between an input-side connection point of the choke coil L1 and the ground potential GND. The capacitor C1 is connected between an output-side connection point of the choke coil L1 and the ground potential GND.

Between the connection point X of the switching power supply 5 and the input terminal X1 of the filter module 1, a coil L0 is connected. In an on-period of the power transistor T, electric power is supplied from the power supply voltage VIN to the coil L0, whereby electromagnetic energy is accumulated in the coil L0. In an off-period of the power transistor T, the accumulated energy is released to the output side including the capacitor C0 of the filter module 1 due to a current from the diode D. In the switching power supply 5, these operations are repeated at the predetermined switching frequency f.

In the switching power supply 5, the current via the power transistor T toward the connection point X and the current via the diode D toward the connection point X alternately flow at the switching frequency f in accordance with a load current. Accordingly, in the switching power supply 5, between the power supply voltage VIN and the ground potential GND, a current in accordance with the load current flows intermittently at the switching frequency f. Consequently, current variations are caused. In addition, the potential at the connection point X is alternately switched between the power supply voltage VIN and the ground potential GND in accordance with the switching frequency f. Thus, the current variation and voltage variation due to the switching operation cause a switching noise having the switching frequency f and harmonic frequencies thereof. In this way, the switching power supply 5 may constitute a noise source. The switching noise may propagate to the input terminal X1 in the form of, for example, conductive noise that sneaks around via the signal path and ground wiring, or inductive noise that propagates via a space including, e.g., capacitive coupling.

As described above, the filter module 1 according to the present embodiment is connected to the connection point X via the coil L0. The filter module 1 decreases the noise due to the operation of the switching power supply 5 including the switching frequency f and harmonic frequencies thereof. The switching frequency f of the switching power supply 5 is determined by, e.g., the output electric power rating and the specifications of the elements included in the circuit. For example, some of the vehicle-mounted switching power supplies are operated at several 100 kHz. In such cases, the switching frequency f and harmonic frequencies thereof may overlap the frequency band of the vehicle-mounted AM radio (around 500 to 1700 kHz). In contrast, the filter module 1 according to the present embodiment is connected to the connection point X, whereby the propagation of noise in such frequency band to the later-stage device can be suppressed.

Figure 2:
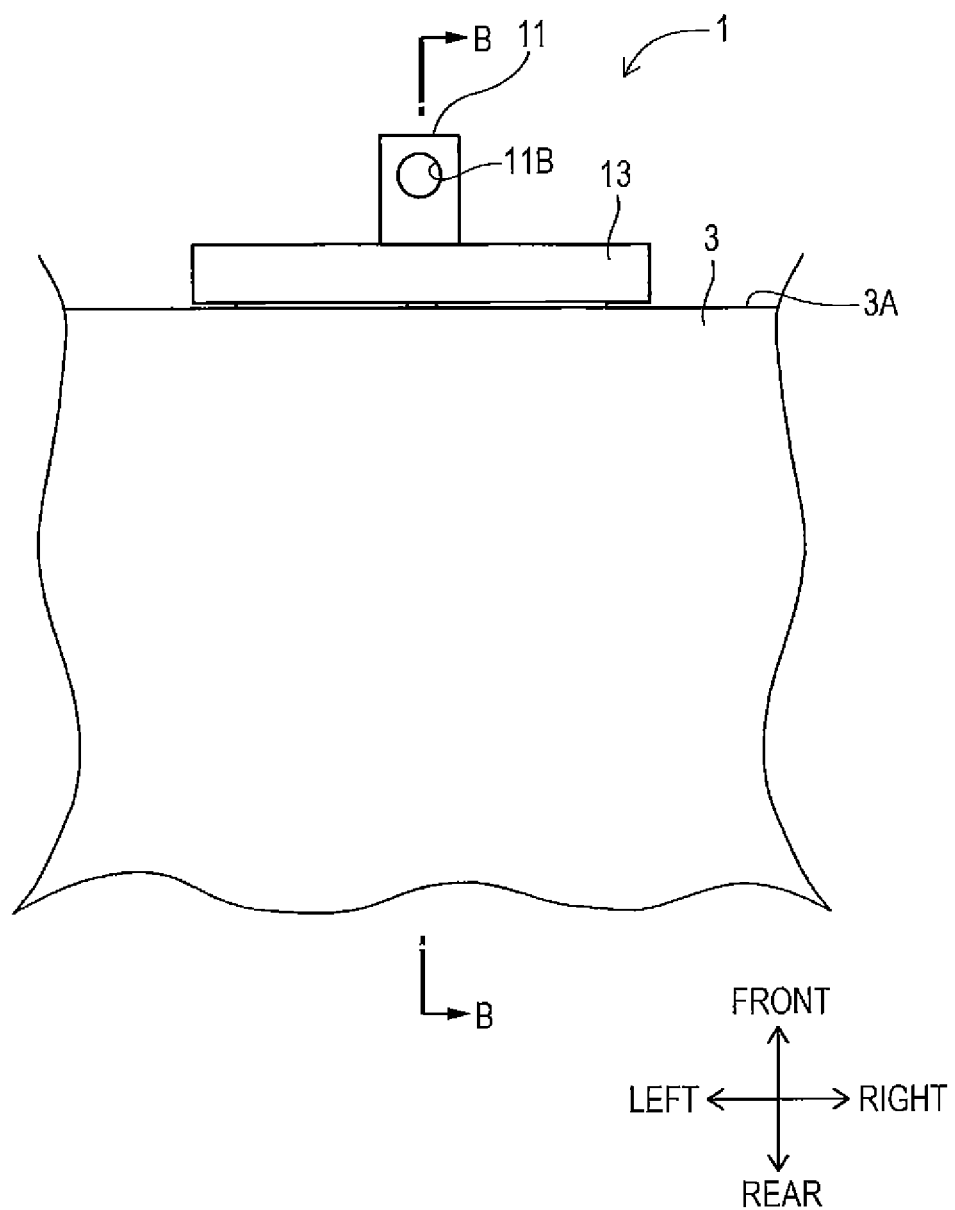
FIG. 2 is a top plan view of the filter module and a filter module attached portion of a metal housing.
Figure 3:
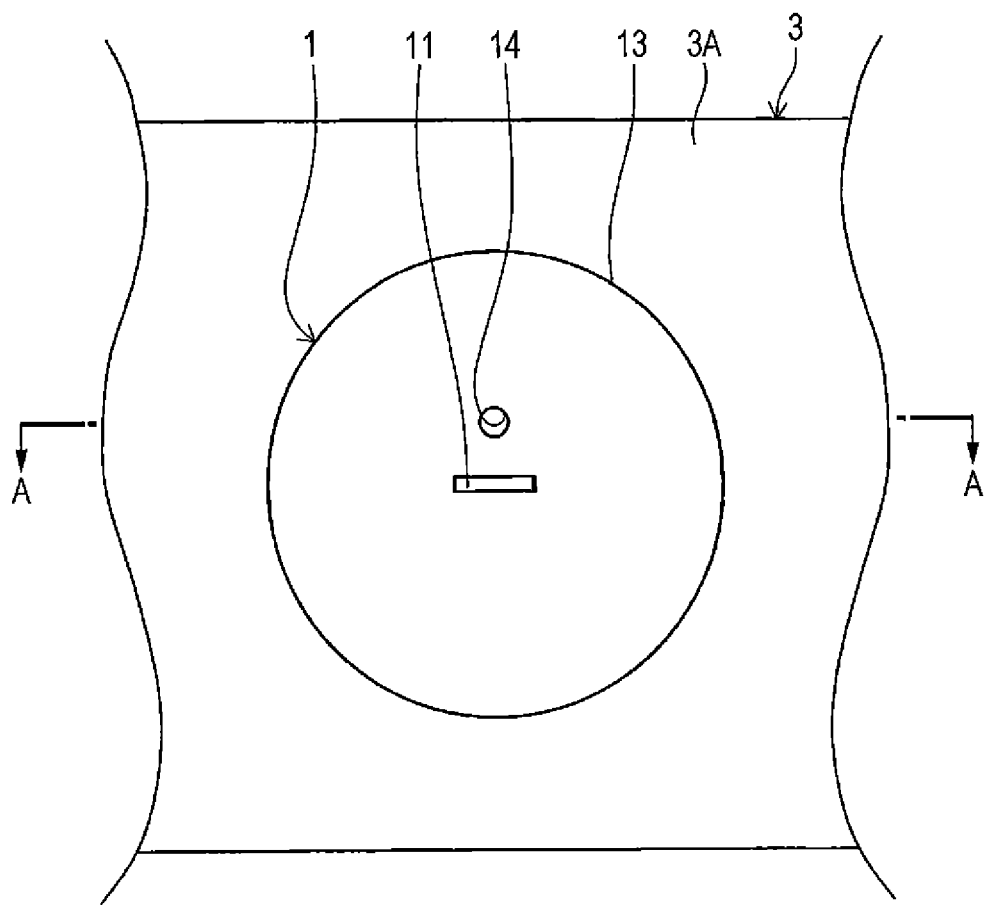
FIG. 3 is a front view of the filter module illustrated in FIG. 2.
Figure 3:
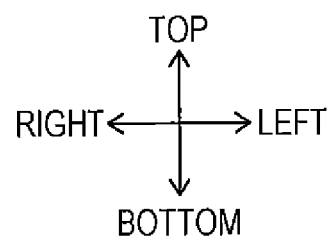

The shape and structure of the filter module 1 will be described. FIG. 2 to FIG. 5 illustrate a part of the metal housing 3 of FIG. 1. In these figures, only the portion where the filter module 1 is attached is illustrated. FIG. 2 is a top plan view of the metal housing 3 with the filter module 1 attached thereto. FIG. 3 is a front view of the filter module 1 illustrated in FIG. 2.

As illustrated in FIG. 2, the filter module 1 includes a conductive bar 11 and a blocking unit 13. The conductive bar 11 corresponds to the output voltage path connecting the input terminal X1 and the output terminal VO of the filter module 1 illustrated in FIG. 1. The conductive bar 11 has a rectangular, board-like shape extending in one direction (see FIG. 4). In the following description with reference to FIG. 2 to FIG. 5, the longitudinal direction in which the conductive bar 11 extends will be referred to as a front-rear direction; the direction perpendicular to the flat plate of the conductive bar 11 as a top-bottom direction; and the direction perpendicular to the front-rear direction and the top-bottom direction as a right-left direction.

Figure 4:
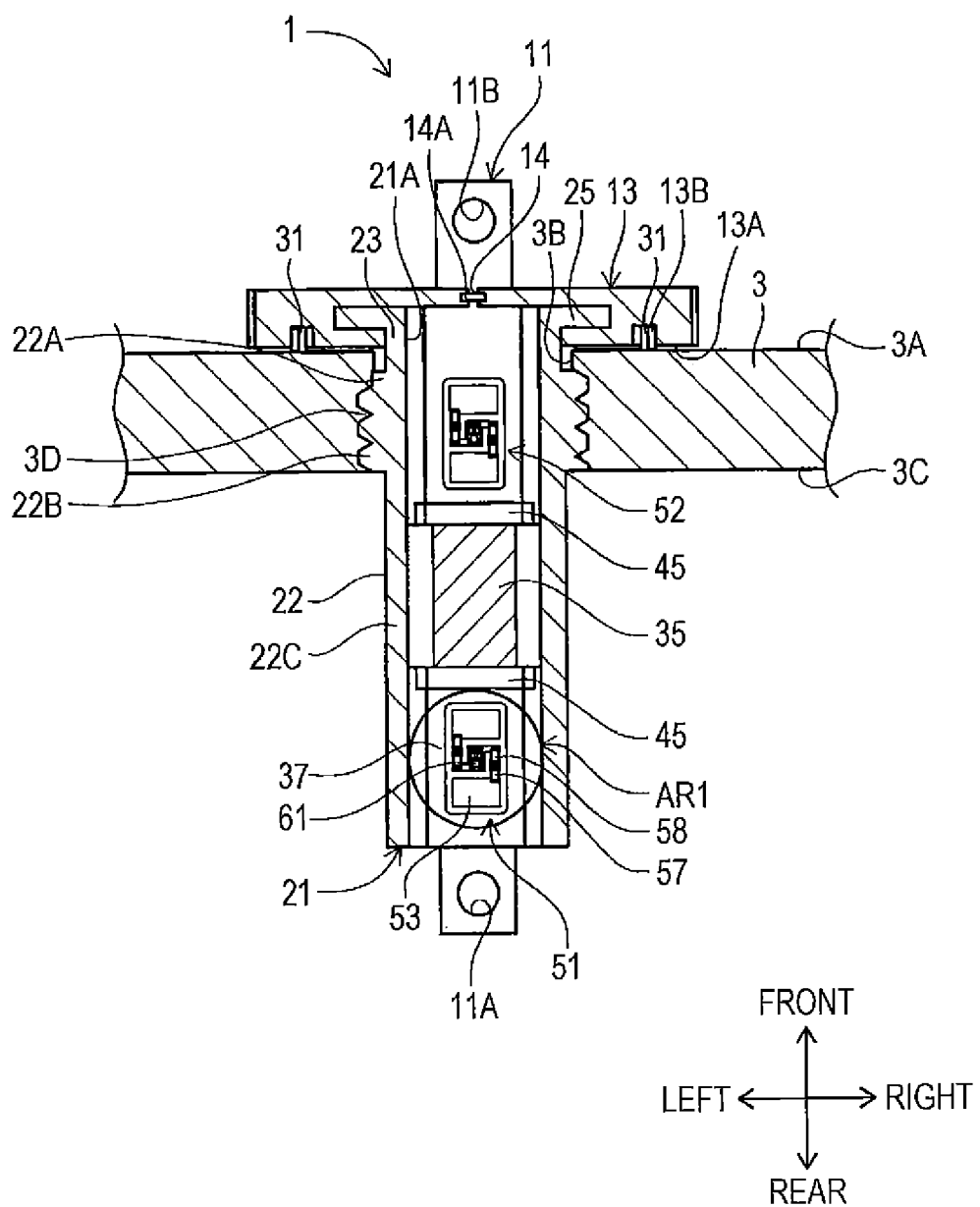
FIG. 4 is a cross sectional view of the filter module taken along line A-A of FIG. 3.

As viewed from above, the conductive bar 11 has a substantially oblong shape extending in the front-rear direction (see FIG. 4). The material of the conductive bar 11 may be a metal material, such as tough pitch copper, aluminum, or carbon steel. The conductive bar 11 has a connection hole 11A with a circular cross section provided in the rear side end thereof through the top-bottom direction (See FIG. 4). The connection hole 11A functions as the input terminal X1 illustrated in FIG. 1. The input terminal X1 is connected to the connection point X via the coil L0 provided in the metal housing 3. As illustrated in FIG. 2, the conductive bar 11 also includes a connection hole 11B having a circular cross section provided in the front side end thereof through the top-bottom direction. The connection hole 11B is connected as the output terminal VO illustrated in FIG. 1 to the auxiliary battery.

As illustrated in FIG. 2 and FIG. 3, as viewed from the front, the blocking unit 13 has a circular shape. The blocking unit 13 has a board-like form having a predetermined thickness in the front-rear direction. To substantially the central portion of the blocking unit 13, the conductive bar 11 provided through the blocking unit 13 in the front-rear direction is affixed. The blocking unit 13 may be molded using thermoplastic resin (for example, polybutylene terephthalate (PBT) or polyphenylene sulfide (PPS)). The blocking unit 13 may be integrally molded with the conductive bar 11 by performing insert molding with a front side part of the conductive bar 11 installed in a mold. The material of the blocking unit 13 is not limited to thermoplastic resin, and thermosetting resin may be used (for example, unsaturated polyester). Thermoplastic resin generally has a shorter molding cycle than thermosetting resin and may therefore contribute to a decrease in manufacturing cost. In this respect, thermoplastic resin may be preferable as the material for the blocking unit 13.

FIG. 4 is a cross sectional view of the filter module 1 taken along line A-A of FIG. 3 as viewed from top. As illustrated in FIG. 4, the filter module 1 includes a tubular portion 21 enclosing the surroundings of the conductive bar 11. An example of the material of the tubular portion 21 is tough pitch copper. The tubular portion 21 includes a cylinder part 22, an extension part 23, and a flange portion 25. The metal housing 3 includes an attachment hole 3B for inserting the conductive bar 11 and the tubular portion 21. The attachment hole 3B has a columnar shape penetrating through the metal housing 3 in the front-rear direction. The attachment hole 3B connects a housing front surface 3A of the metal housing 3 and a housing rear surface 3C on the rear side thereof. In addition, the attachment hole 3B has an internally screwed engagement part 3D for screwed engagement with the tubular portion 21.

The cylinder part 22 of the tubular portion 21 has a cylindrical shape extending in the front-rear direction. The outer peripheral portion of the cylinder part 22 is provided, from a front end 22A thereof toward the rear side, with a screwed engagement part 22B in screwed engagement with the internally screwed engagement part 3D of the attachment hole 3B. The outer peripheral portion of the cylinder part 22 to the rear of the screwed engagement part 22B includes a small diameter part 22C. The small diameter part 22C has a cylindrical shape with a diameter smaller than that of the portion of the cylinder part 22 including the screwed engagement part 22B. The small diameter part 22C extends in the front-rear direction to a position covering the surroundings of a substrate 51 which will be described below.

The front end 22A of the cylinder part 22 is accommodated in the attachment hole 3B. The extension part 23 extends from the front end 22A toward the front and to the outside of the attachment hole 3B. The extension part 23 has a cylindrical shape with a diameter smaller than that of the portion of the cylinder part 22 including the screwed engagement part 22B.

The flange portion 25 is disposed on the front side end of the extension part 23. The flange portion 25 is an annular member having a constant width from the outer peripheral surface of the cylindrical extension part 23 to the outside in the diameter direction thereof. The flange portion 25 has an outer diameter greater than the outer diameter of the cylinder part 22. The blocking unit 13 seals portions including the whole of the flange portion 25 and a part of the extension part 23. The blocking unit 13 seals front and rear surfaces of the flange portion 25. When a rotational force acts on the blocking unit 13 about a rotating axis in the front-rear direction, frictional force is produced between the blocking unit 13 and the flange portion 25. The rotational force applied to the blocking unit 13 is transmitted to the cylinder part 22 as a rotational torque. As a result, the cylinder part 22 rotates together with the blocking unit 13.

The shape of the extension part 23 is not limited to the annular shape. The extension part 23 may have, as viewed from the front, a rectangular or a cross shape. The extension part 23 may have slits disposed at predetermined intervals along the circumferential direction of the annular shape, and the slits may be filled with the resin of the blocking unit 13. In this way, the efficiency of transmission of force from the blocking unit 13 to the cylinder part 22 can be increased. Alternatively, the surface of the flange portion 25 may be coated with an adhesive so as to secure the flange portion 25 and the blocking unit 13 to each other more strongly. The flange portion 25 may have an irregular portion on the front surface thereof. The flange portion 25 may be otherwise processed to increase the contact area and/or frictional force between the flange portion 25 and the blocking unit 13.

When the filter module 1 is attached to the metal housing 3, initially the small diameter part 22C of the cylinder part 22 is inserted into the attachment hole 3B of the metal housing 3 from the front side thereof. The cylinder part 22 is inserted into the attachment hole 3B until the screwed engagement part 22B of the cylinder part 22 meets the internally screwed engagement part 3D. Then, the blocking unit 13 is rotated so as to cause the screwed engagement part 22B to be screwedly engaged with the internally screwed engagement part 3D. As the blocking unit 13 is rotated, the tubular portion 21 is moved in the attachment hole 3B toward the rear. Thus, the filter module 1 is physically affixed to the metal housing 3 by being screwedly engaged with the metal housing 3. In addition, the tubular portion 21 is electrically connected to the metal housing 3. Accordingly, ground potential GND is supplied from the metal housing 3 to the tubular portion 21.

A packing 31 is disposed between a housing front surface 3A of the metal housing 3 and an opposing rear surface 13A of the blocking unit 13. An example of the material used for the packing 31 is silicon rubber. The packing 31 has an annular shape enclosing the surroundings of the conductive bar 11. The rear surface 13A of the blocking unit 13 has a groove 13B recessed from the rear toward the front. The groove 13B has an annular shape matching the shape of the packing 31, and the packing 31 is embedded in the groove 13B. When the filter module 1 is affixed to the metal housing 3, the packing 31 is held between the bottom of the groove 13B of the blocking unit 13 and the housing front surface 3A, in accordance with the force with which the screwed engagement part 22B of the cylinder part 22 is fastened to the internally screwed engagement part 3D of the metal housing 3 by screwed engagement therewith. Accordingly, the packing 31 can fill a gap between the blocking unit 13 and the metal housing 3. The packing 31 thus functions as a seal member for suppressing the entry of liquid into the attachment hole 3B and the metal housing 3 from outside the metal housing 3.

The tubular portion 21 also includes a through hole 21A penetrating therethrough in the front-rear direction and on the inside in the diameter direction of the cylinder part 22, the extension part 23, and the flange portion 25. The through hole 21A has a columnar shape with the central axis aligned with the front-rear direction. The conductive bar 11 is inserted into the through hole 21A of the tubular portion 21. As illustrated in FIG. 3, the blocking unit 13 has a ventilation hole 14 above the conductive bar 11 affixed to the center portion. As illustrated in FIG. 4, the ventilation hole 14 is provided through the blocking unit 13 along the front-rear direction. In this way, communication is provided between the inside of the through hole 21A and the outside of the metal housing 3. In the ventilation hole 14, at substantially the center in the front-rear direction, a waterproof ventilation member 14A is provided that permits the passage of gas but does not permit the passage of liquid. The waterproof ventilation member 14A may include waterproof and moisture-permeable material, such as Gore-Tex (registered trademark).

Next, the configuration inside the tubular portion 21 in the filter module 1 will be described. As illustrated in FIG. 4, to substantially the central portion in the front-rear direction of the conductive bar 11, a magnetic material core 35 is attached. The magnetic material core 35 has a hollow cylindrical shape including a hollow portion 35A (see FIG. 5) provided therethrough in the front-rear direction. An example of the material for the magnetic material core 35 is a magnetic material, such as a soft ferrite. The magnetic material core 35 has an elliptical shape longer in the right-left direction as viewed in the front-rear direction. Also, the hollow portion 35A of the magnetic material core 35 has an elliptical shape longer in the right-left direction as viewed in the front-rear direction. The width of the hollow portion 35A in the right-left direction is greater than the width of the conductive bar 11. Accordingly, the conductive bar 11 can be inserted into the hollow portion 35A. The magnetic material core 35 is disposed such that the conductive bar 11 inserted into the hollow portion 35A is opposed to the inner surface of the hollow portion 35A of the magnetic material core 35. This allows the magnetic material core 35 to function as the choke coil L1 (see FIG. 1).

Figure 5:
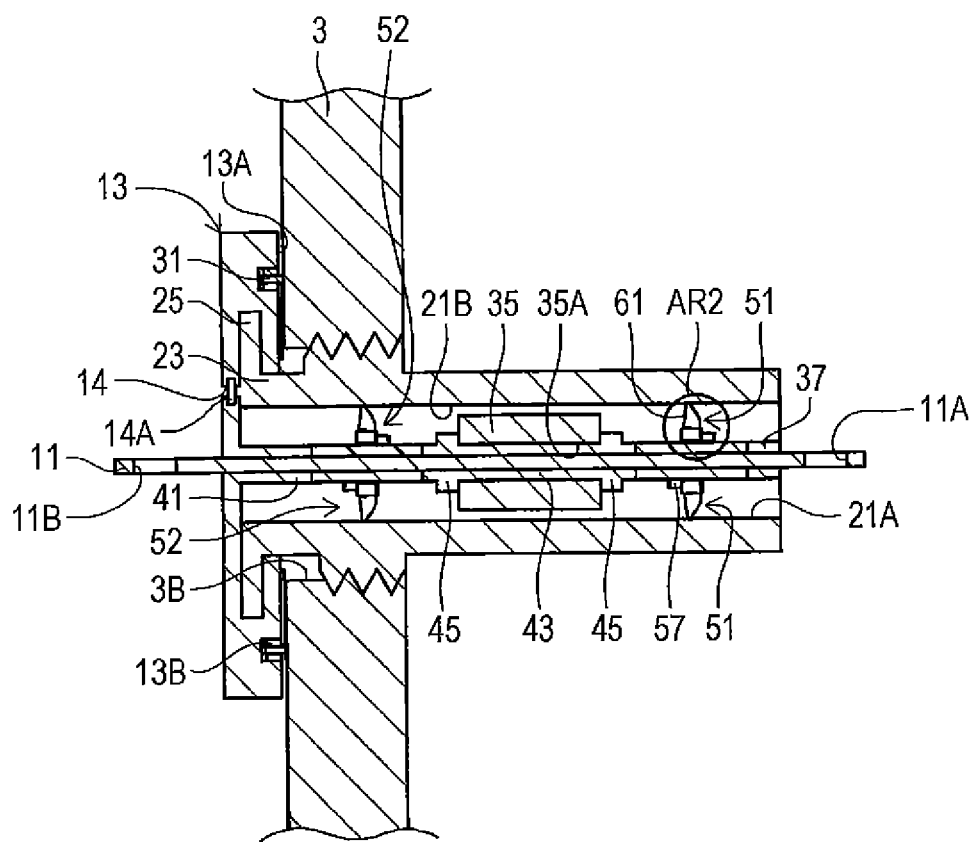
FIG. 5 is a cross sectional view of the filter module taken along line B-B of FIG. 2.
Figure 5:
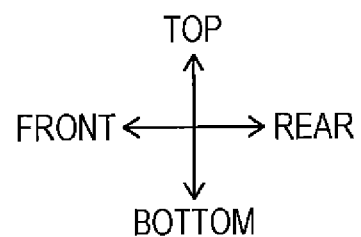

The magnetic material core 35 has slits (not illustrated) at the center in the top-bottom direction thereof, the slits being opposed to each other in the right-left direction. The slits connect the inner peripheral surface and the outer peripheral surface of the magnetic material core 35. In other words, the magnetic material core 35 is divided by the two slits into upper and lower portions. These slits provide a so-called core gap. The core gap makes the magnetic path around the magnetic material core 35 partly discontinuous. By modifying the width and the like of the slits, magnetic resistance can be adjusted so as to suppress the development of magnetic saturation. By adjusting the width of the slits, it also becomes possible to suppress magnetic saturation, whereby the inductance of the choke coil L1 necessary for noise component removal can be ensured. The width in the left-right direction of the through hole 21A provided in the tubular portion 21 is substantially the same as the width of the magnetic material core 35. FIG. 5 is a cross sectional view of the filter module taken along line B-B of FIG. 2, as viewed from the left side. As illustrated in FIG. 5, the width of the through hole 21A in the top-bottom direction is greater than the width of the magnetic material core 35. The through hole 21A has an inner wall 21B which is opposed to the outer peripheral surface of the magnetic material core 35 via a predetermined gap.

As illustrated in FIG. 5, the conductive bar 11 is sealed by a mold portion 37 in the portion of the conductive bar 11 to the rear of where the conductive bar 11 is affixed to the blocking unit 13; i.e., in the portion accommodated within the through hole 21A. The mold portion 37 having a predetermined thickness is disposed on the surface of the conductive bar 11. The mold portion 37 seals the conductive bar 11 as a whole. A front side end 41 of the mold portion 37 is connected to the rear surface 13A of the blocking unit 13. The mold portion 37 may be molded, for example, in the same insert molding step of molding the blocking unit 13 using the same resin material (thermoplastic resin) for the blocking unit 13.

The mold portion 37 includes a filler portion 43 disposed so as to fill the space in the hollow portion 35A of the magnetic material core 35. When the filler portion 43 is disposed in the hollow portion 35A of the magnetic material core 35, the position of the magnetic material core 35 in the top-bottom direction and the right-left direction is determined. The magnetic material core 35 may be affixed with respect to the conductive bar 11 and the filler portion 43 by, for example, having an insulating tape (not illustrated) wound on the outer peripheral surface thereof.

The mold portion 37 also includes annular portions 45 at the ends of the filler portion 43 in the front-rear direction. The annular portions 45 have greater widths in the top-bottom direction and the right-left direction than the other portions of the mold portion 37 (such as the filler portion 43 and the portion between the annular portions 45 and an end 41). In other words, the annular portions 45 protrude from the mold portion 37, covering the surface of the conductive bar 11, toward the outside in the top-bottom direction and the right-left direction. The magnetic material core 35 is sandwiched between the annular portions 45 disposed to the front and rear, i.e., from both sides in the front-rear direction. In this way, the position of the magnetic material core 35 in the front-rear direction is fixed.

As illustrated in FIG. 4, on the upper surface of the conductive bar 11, a substrate 51 is mounted between the magnetic material core 35 and the rear side connection hole 11A. The substrate 51 has a substantially oblong shape longer in the front-rear direction as viewed from above. The outer peripheral portion of the substrate 51 is sealed by the mold portion 37. The substrate 51 is a glass epoxy substrate (FR-4), for example.

Figure 6:
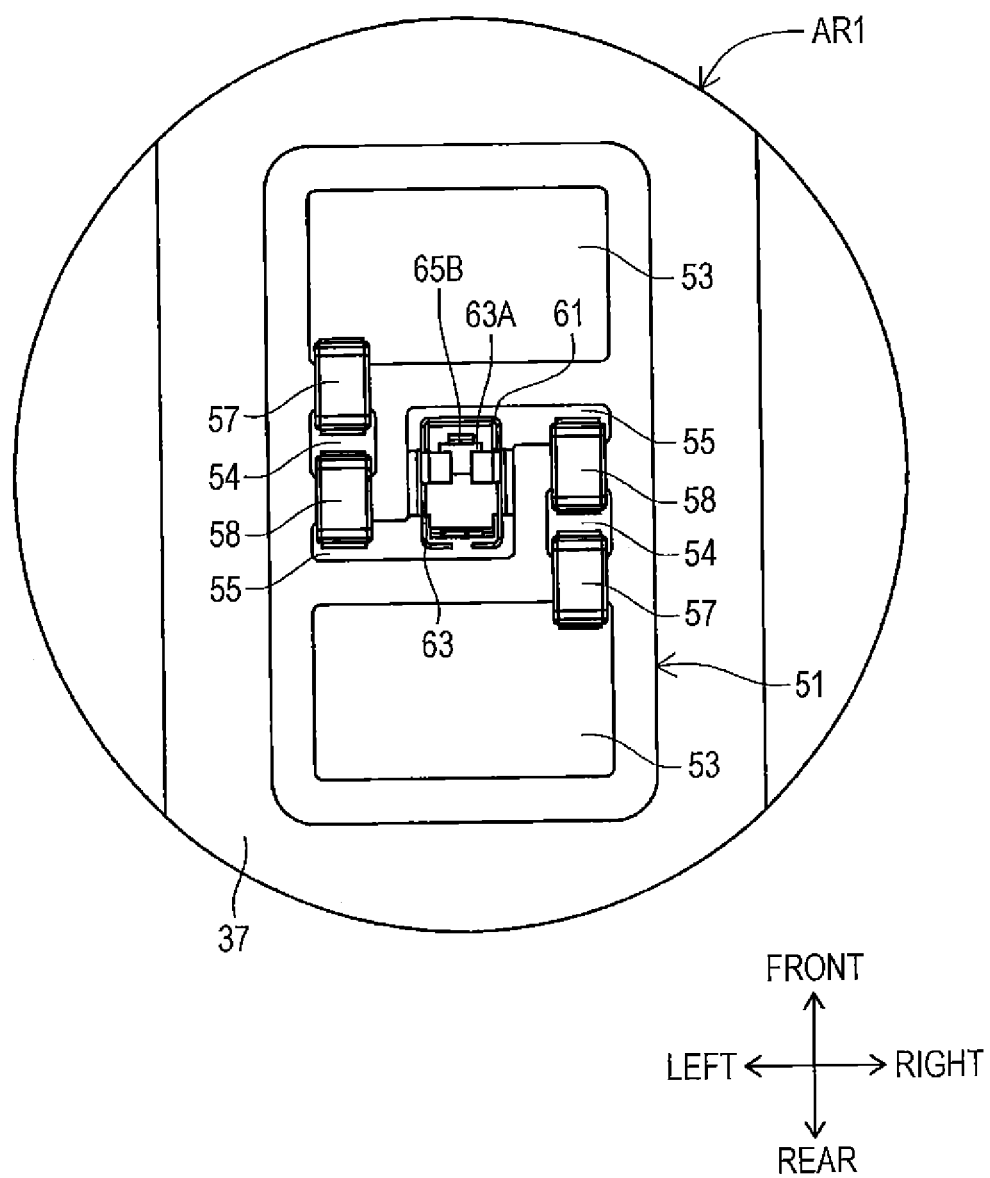
FIG. 6 is an enlarged view of a region AR1 indicated in FIG. 4.

FIG. 6 is an enlarged view of the substrate 51, showing a region AR1 in FIG. 4. As illustrated in FIG. 6, the substrate 51 includes first electrodes 53, second electrodes 54, and third electrodes 55. The respective sets of the first to third electrodes 53 to 55 are disposed at point-symmetric positions with respect to the center of the substrate 51. Accordingly, in the following description, a circuit configuration connected to the first electrode 53 on the front side will be described as a representative example. Description of a circuit configuration connected to the first electrode 53 on the rear side will be omitted whenever appropriate.

The first electrode 53 on the front side is disposed at the front end portion of the substrate 51. The first electrode 53 has a substantially oblong shape longer in the right-left direction as viewed in plan. The lower surface of the first electrode 53 is abutted on the upper surface of the conductive bar 11. Accordingly, the first electrode 53 is electrically connected to the conductive bar 11. The substrate 51 is affixed with respect to the conductive bar 11 by having the first electrode 53 joined to the conductive bar 11 by spot welding, for example. The method for affixing the substrate 51 to the conductive bar 11 is not limited to spot welding. For example, the substrate 51 may be affixed to the conductive bar 11 by means of fasteners such as bolts. In an exemplary procedure for affixing the substrate 51 to the conductive bar 11, the substrate 51 may be affixed to the conductive bar 11 by spot welding, and then the mold portion 37 may be insert-molded. In this way, the outer peripheral portion of the substrate 51 can be sealed.

A rear-left side portion of the first electrode 53 is connected to a front end portion of the second electrode 54 via a chip capacitor 57. The chip capacitor 57 is mounted on the surfaces of the first electrode 53 and the second electrode 54 so as to couple the respective members. The second electrode 54 has a substantially square shape in plan. A rear end portion of the second electrode 54 is connected to the third electrode 55 via a chip capacitor 58. The chip capacitor 58 is mounted on the surfaces of the second electrode 54 and the third electrode 55 so as to couple the respective members. In this way, the chip capacitors 57 and 58 are surface-mounted on the first to third electrodes 53 to 55. By thus omitting lead wires, the connecting distance between the metal housing 3 and the chip capacitors 57 and 58 can be decreased, whereby the equivalent series inductance (ESL) can be decreased. The third electrode 55 is disposed extending from a left side end portion connected to the chip capacitor 58 to the right side, toward the center of the substrate 51. As opposed to the first electrode 53, the lower surfaces of the second electrode 54 and the third electrode 55 are covered with the resin of the substrate 51. Accordingly, the second electrode 54 and the third electrode 55 are insulated from the conductive bar 11.

Figure 7:
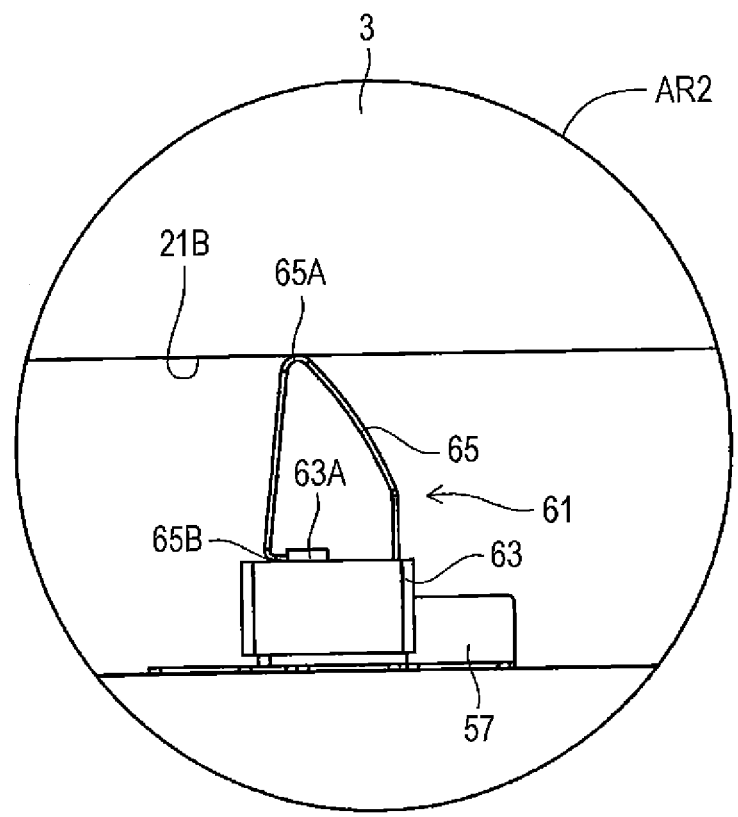
FIG. 7 is an enlarged view of a region AR2 indicated in FIG. 5.
Figure 7:
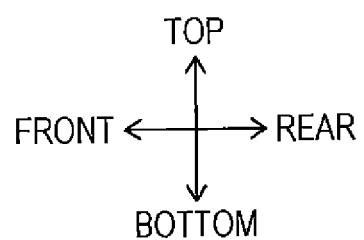

At the center of the substrate 51, a contact portion 61 is disposed. FIG. 7 is an enlarged view of the contact portion 61, showing a region AR2 in FIG. 5. The contact portion 61 may be an On-board Contact (registered trademark), for example. The contact portion 61 may include a metal member, such as stainless steel, beryllium copper, or phosphor bronze surface-treated with titanium copper (for example, hyper titanium copper manufactured by JX Nippon Mining & Metals Corporation), tin-plating, or metal-plating.

The contact portion 61 is formed by processing a thin-plate metal member, for example. The contact portion 61 includes a base portion 63 and a touching portion 65. The base portion 63 is electrically connected to the center portion of each of the pair of third electrodes 55 (see FIG. 7). The base portion 63 is elastically deformed when pressed from above, thereby producing rebounding force. The touching portion 65 is processed and formed so as to protrude upward and toward the front from the upper surface of the rear side of the base portion 63, and be bent down at an upper-end portion 65A. On top of the base portion 63, there is disposed a catch portion 63A having a through hole in the front-rear direction. As a bent front-end portion 65B of the touching portion 65 is inserted into the catch portion 63A from the front side, the touching portion 65 is engaged with the base portion 63.

In the process of manufacturing the filter module 1, for example, after the conductive bar 11 with the substrate 51 and the like mounted thereon is inserted into the through hole 21A of the tubular portion 21, insert molding for molding the mold portion 37 and the blocking unit 13 is implemented. When the conductive bar 11 with the substrate 51 and the like mounted thereon is inserted into the tubular portion 21, the upper end 65A of the touching portion 65 of the contact portion 61 contacts the inner wall 21B of the through hole 21A. As a result, the contact portion 61 and the tubular portion 21 are electrically connected to each other. Accordingly, the contact portion 61 is supplied with ground potential GND from the metal housing 3 via the tubular portion 21.

As the upper-end portion 65A and the inner wall 21B contact each other, the touching portion 65 is bent toward the front. This causes the front-end portion 65B to move toward the rear and become more deeply inserted into the catch portion 63A. Accordingly, the touching portion 65 becomes strongly engaged with the base portion 63. As the touching portion 65 is pressed downward by the inner wall 21B, rebounding force is generated in the elastically deformed base portion 64. By thus having a part of the touching portion 65 including the upper-end portion 65A strongly pressed onto the inner wall 21B, good conduction can be ensured.

The substrate 51 having the above-described configuration has a total of four chip capacitors 57 and 58 mounted between the conductive bar 11 and the ground potential GND (the inner wall 21B of the tubular portion 21). The four chip capacitors 57 and 58 include the two sets of chip capacitors 57 and 58 mounted in parallel, each set including two chip capacitors connected in series. As illustrated in FIG. 6, on the lower surface of the conductive bar 11, another substrate 51 is mounted at a position corresponding to that of the substrate 51 on the upper surface. A circuit on the substrate 51 on the lower surface has the same configuration as the circuit on the substrate 51 on the upper surface. The substrates 51 mounted on the upper and lower surfaces of the conductive bar 11 between the magnetic material core 35 and the rear side connection hole 11A correspond to the capacitor C0 in FIG. 1.

Between the blocking unit 13 and the magnetic material core 35 in the front-rear direction, substrates 52 are mounted on both the upper and lower surfaces of the conductive bar 11. The substrates 52 include circuits having the same configuration as that of the circuit of the substrates 51. The substrates 52 mounted on the conductive bar 11 between the blocking unit 13 and the magnetic material core 35 correspond to the capacitor C1 in FIG. 1. Thus, the filter module 1 includes the filter circuit including the conductive bar 11, the magnetic material core 35, the substrates 51, and the substrates 52.

In the above-described embodiment, the filter module 1 is an example of a noise reduction device, and the switching power supply 5 is an example of an electronic device.

As described above in detail, the filter module 1 according to the above-described embodiment is connected in the output path linking the connection point X and the output terminal VO of the switching power supply 5. Accordingly, the filter module 1 can decrease the noise that is generated due to the operation of the switching power supply 5 and that then becomes mixed in the output voltage transmitted along the output path. The capacitor C0 (the chip capacitors 57 and 58 on the substrates 51), the capacitor C1 (the chip capacitors 57 and 58 on the substrates 52), and the choke coil L1 (the magnetic material core 35) included in the π-type filter circuit are accommodated in the through hole 21A of the tubular portion 21. The electromagnetic coupling of the various circuit elements (such as the capacitor C0) included in the filter module 1 and the switching power supply 5 is suppressed by the electromagnetic shield effect provided by the metal tubular portion 21. Accordingly, the entry of electromagnetic coupling noise due to the operation of the switching power supply 5 into the various circuit elements in the through hole 21A can be suppressed. As a result, propagation of noise to the output terminal VO can be suppressed by the filter module 1.

The chip capacitors 57 and 58 mounted on the substrates 51 and 52 are connected to the inner wall 21B of the through hole 21A. Accordingly, the ground potential GND is supplied from the metal housing 3 to the chip capacitors 57 and 58, via the tubular portion 21. This enables a decrease in the connecting distance between the chip capacitors 57 and 58 and the metal housing 3 in the filter module 1 according to the present embodiment, compared with the conventional filter module. As a result, a decrease in ESL can be achieved.

The through hole 21A accommodating the chip capacitors 57 and 58, the magnetic material core 35 and the like of the filter module 1 are blocked by the blocking unit 13. This makes it possible to suppress the attachment of liquid to various circuit elements, such as the chip capacitors 57 and 58, and the wiring connecting the circuit elements, on the outside of the metal housing 3. Accordingly, a decrease in conduction due to rust and the like can be suppressed.

Also, as illustrated in FIG. 4, the cylinder part 22 includes a small diameter part 22C extending further toward the rear from the rear end of the screwed engagement part 22B screwedly engaged with the internally screwed engagement part 3D of the metal housing 3. The small diameter part 22C is thus disposed on the inside (within the metal housing 3) of the internally screwed engagement part 3D of the metal housing 3. In order to protect the chip capacitor 57 and the like from switching noise by the electromagnetic shield effect, the cylinder part 22 may have a front-rear direction length such that the chip capacitor 57 and the like can be accommodated in the through hole 21A. Meanwhile, the number of screws, pitch, size and the like of the screwed engagement part 22B may be determined in accordance with the sufficient strength for affixing the filter module 1 to the metal housing 3. For example, as illustrated in FIG. 4, the screwed engagement part 22B has approximately three screws along the front-rear direction. In this configuration of the tubular portion 21, the internally screwed engagement part 3D can be reduced in size by decreasing the number of screws of the screwed engagement part 22B, for example, in accordance with the required strength, while the chip capacitor 57 and the like are protected from noise by the cylinder part 22 having a necessary length. Thus, the thickness of the metal housing 3 can be reduced. As a result, the metal housing 3 can be reduced in size, for example.

Figure 8:
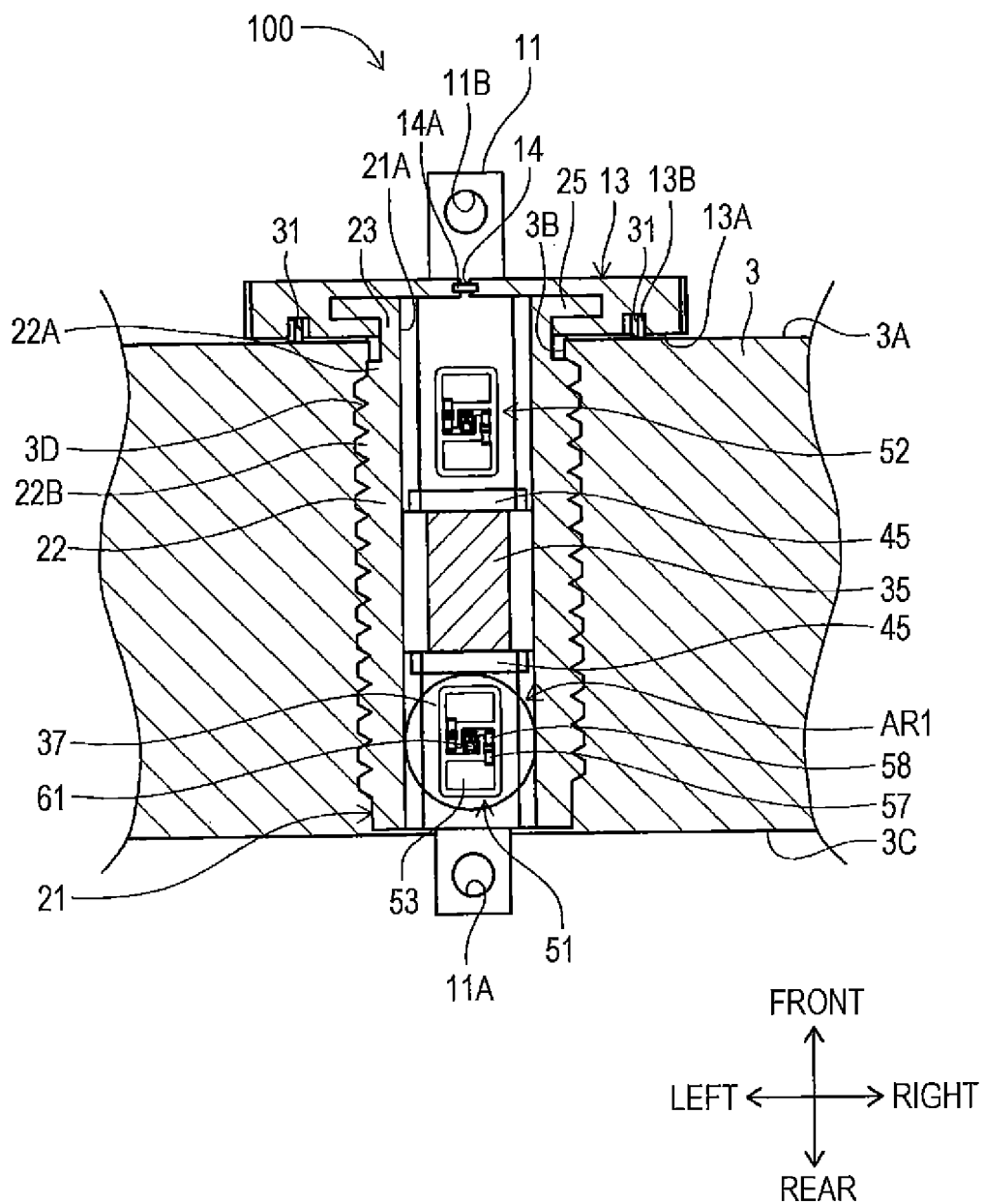
FIG. 8 is a cross sectional view of a filter module according to another example.

The present embodiment is not limited to the above-described embodiment, and various improvements or modifications may of course be made to the above-described embodiment without departing from the spirit or scope. For example, in the above-described embodiment, the cylinder part 22 of the tubular portion 21 may be entirely accommodated in the attachment hole 3B of the metal housing 3. FIG. 8 illustrates a configuration of the filter module 100 according to another example. FIG. 8 corresponds to FIG. 4 illustrating the above-described embodiment. In the following description, members same as those of the above-described embodiment are designated with identical reference signs for description's sake. As illustrated in FIG. 8, the cylinder part 22 of the filter module 100 has the screwed engagement part 22B at the periphery throughout the cylinder part 22 in the front-rear direction, instead of the small diameter part 22C according to the above-described embodiment. The cylinder part 22 is entirely accommodated in the attachment hole 3B. The screwed engagement part 22B is screwedly engaged with the internally screwed engagement part 3D. In this configuration, the cylinder part 22 can be more strongly affixed to the metal housing 3.

Figure 9:
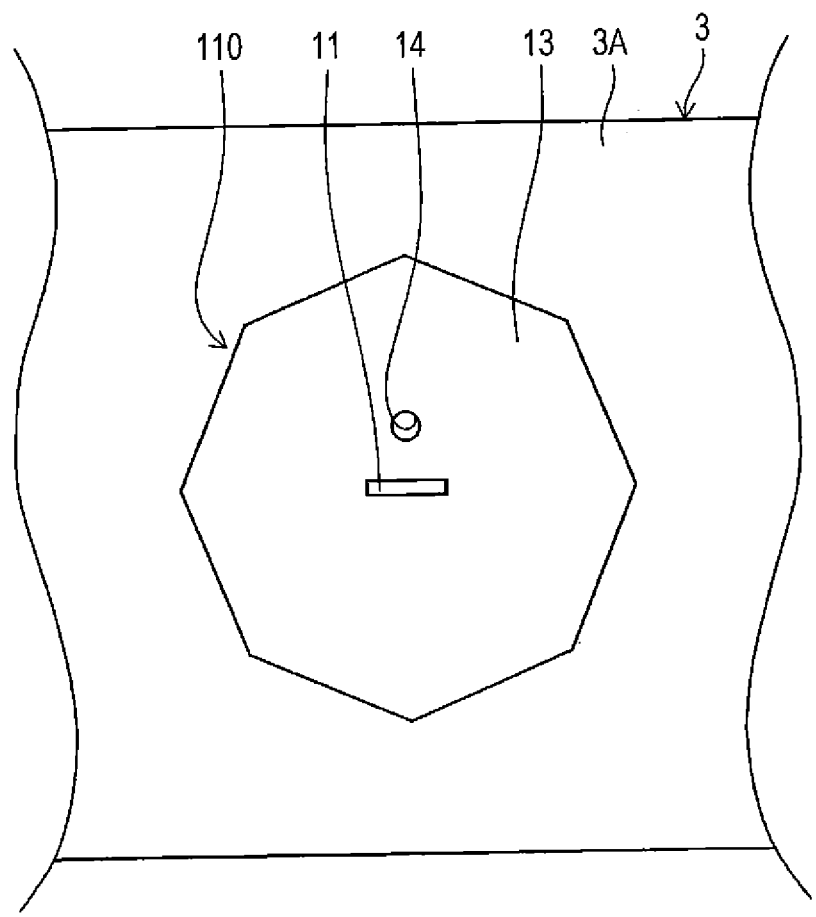
FIG. 9 is a front view of the filter module according to the other example.
Figure 9:
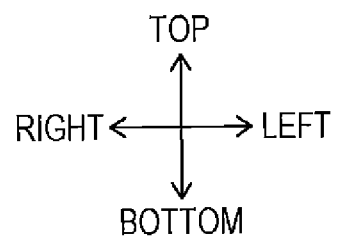

In the above-described embodiment, the blocking unit 13 has a disc shape. However, the shape of the blocking unit 13 is not limited to a disc shape. For example, in a filter module 110 illustrated in FIG. 9, the blocking unit 13 is regular octagonal as viewed from the front. In this configuration, the user can easily hold and rotate the blocking unit 13, and can therefore more easily rotate the filter module 110. For example, a reinforcing member of metal plate and the like may be attached to the outer peripheral portion of the regular octagonal blocking unit 13. In this way, the blocking unit 13 can be rotated using a tool, such as a wrench. In this way, the filter module 1 can be screwedly engaged with and affixed to the metal housing 3 more strongly. As a result, it becomes possible to prevent an increase in contact resistance between the screwed engagement part 22B and the internally screwed engagement part 3D due to a loosening of the screwed engagement part 22B, for example. It also becomes possible to prevent a decrease in waterproof property due to a loosening of the packing 31 between the blocking unit 13 and the metal housing 3.

In the above-described embodiment, the conductive bar 11 is provided with the connection hole 11B as the output terminal VO illustrated in FIG. 1. However, the output terminal VO is not limited to the connection hole 11B. The filter module 1 is attached to the attachment hole 3B of the metal housing 3 by screwed engagement. Accordingly, if the relative positions of the internally screwed engagement part 3D of the metal housing 3 and the screwed engagement part 22B of the cylinder part 22 are displaced from their correct positions, the opening of the connection hole 11B as attached may not be correctly oriented in the top-bottom direction as illustrated in FIG. 2, for example. In other words, there is a possibility that the plane of the conductive bar 11 may not be ensured to be oriented in the top-bottom direction.

Figure 10:
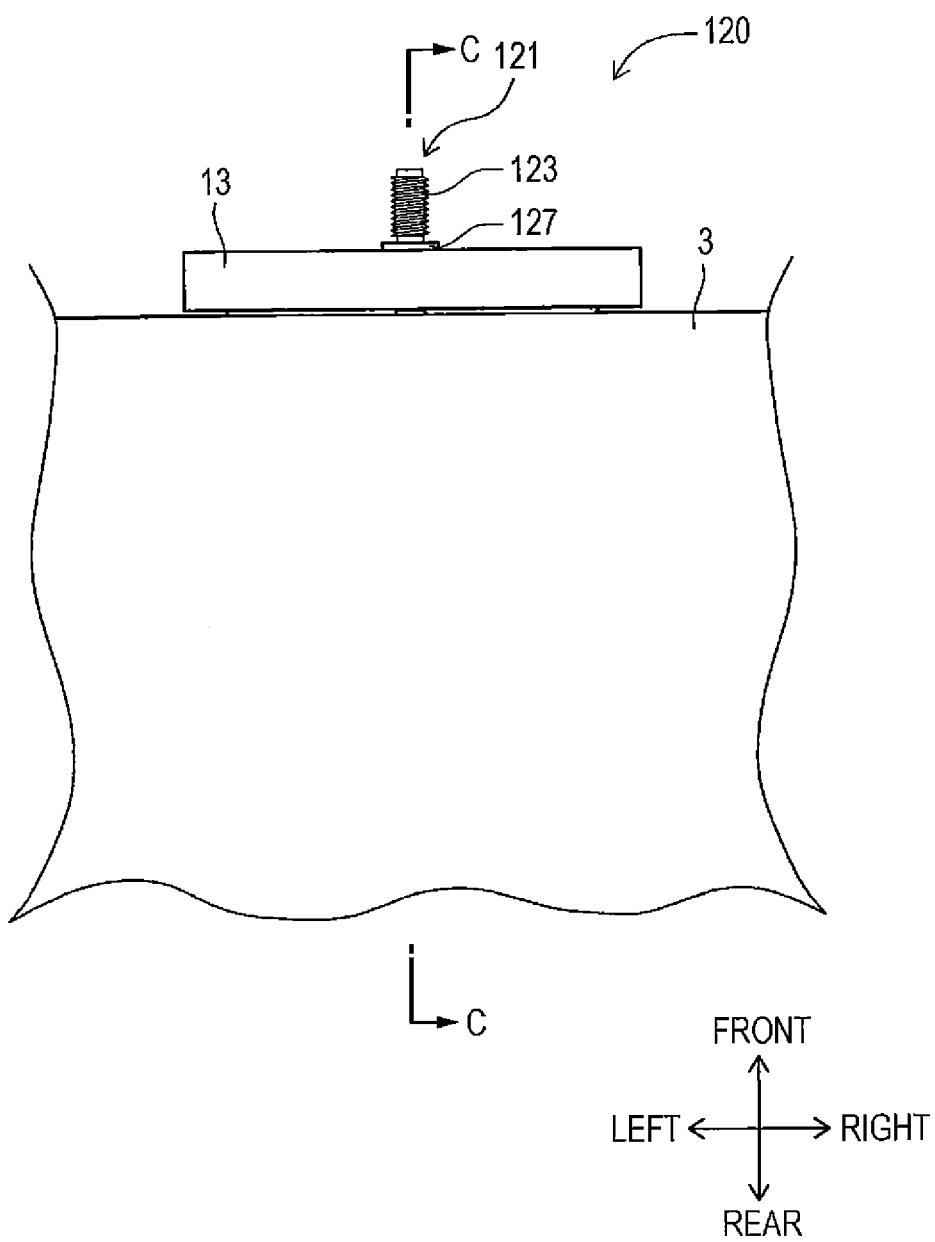
FIG. 10 is a top plan view of the filter module according to the other example and the filter module attached portion of the metal housing.
Figure 11:
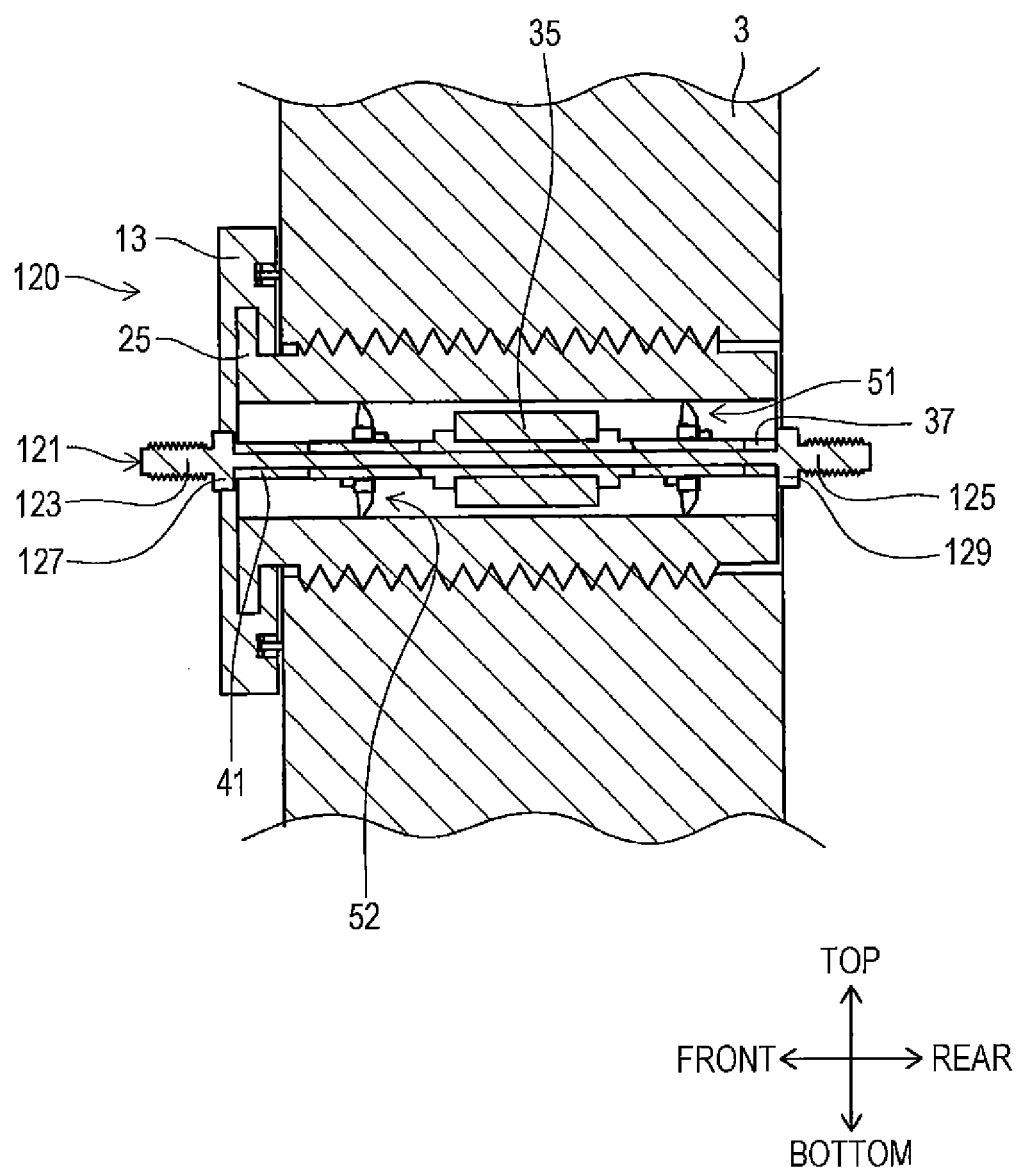
FIG. 11 is a cross sectional view of the filter module taken along line C-C of FIG. 10.

In order to address the problem, the conductive bar 11 may be provided with screwed engagement parts on both ends thereof. FIG. 10 and FIG. 11 illustrate the configuration of a filter module 120 according to another example. FIG. 10 corresponds to FIG. 2 associated with the above-described embodiment. FIG. 11 is a cross sectional view of the filter module 120 taken along line C-C of FIG. 10 as viewed from the left side. Namely, FIG. 11 corresponds to FIG. 5 associated with the above-described embodiment.

As illustrated in FIG. 10 and FIG. 11, the filter module 120 has a conductive bar 121 having, on either end thereof, screwed engagement parts 123 and 125 having external screws. To the rear of the screwed engagement part 123 on the front side, a regulating part 127 is provided. The regulating part 127 has a disc shape with a plane parallel with the top-bottom direction and the left-right direction. Of the regulating part 127, a portion from the center in the front-rear direction to the rear side is sealed by the blocking unit 13. The screwed engagement part 123 protrudes from the front end surface of the regulating part 127, which is exposed on the blocking unit 13, toward the front. Similarly, to the front of the screwed engagement part 125 on the rear side, a regulating part 129 having a disc shape is provided (see FIG. 11). The screwed engagement part 125 protrudes toward the rear from the rear end surface of the regulating part 129.

In this configuration, regardless of the rotation position of the filter module 120 affixed to the metal housing 3 by screwed engagement, the screwed engagement parts 123 and 125 are disposed in parallel with the front-rear direction. Accordingly, regardless of the rotation position of the filter module 120, a connector having an internal screw for connecting to an external device, such as an auxiliary battery, can be affixed to the screwed engagement part 123 by screwed engagement. Similarly, regardless of the rotation position of the filter module 120, a terminal connected to the switching power supply 5 can be affixed to the screwed engagement part 125 by screwed engagement. Alternatively, a terminal (such as the end of a conductive bar) connected to the auxiliary battery may be connected to the conductive bar 121 by fastening a nut onto the screwed engagement part 123 inserted into a hole in the terminal. In this case, the terminal connected to the auxiliary battery and the conductive bar 121 are affixed to each other by being held by the nut and the regulating part 127.

A member including the connection hole 11B may be prepared separately from the conductive bar 11, whereby, when the conductive bar 11 is later provided with the connection hole 11B, the orientation of the connection hole 11B can be adjusted. More specifically, for example, the separate member with the connection hole 11B further includes a screwed engagement part. Also, the conductive bar 11 of the above-described embodiment includes an internally screwed engagement part at the end surface portion facing the front. After the filter module 1 is attached to the metal housing 3, the separate member with the connection hole 11B is screwedly engaged with the conductive bar 11 from the front side thereof. In this way, when the separate member is affixed to the conductive bar 11, the connection hole 11B can be oriented in the top-bottom direction. Accordingly, after the conductive bar 11 is attached to the metal housing 3, the orientation of the connection hole 11B can be adjusted.

Alternatively, a member including an orientation-modifiable output terminal VO may be prepared separately from the conductive bar 11, and the member may be attached to the connection hole 11B. More specifically, for example, the separate member with the output terminal VO the orientation of which can be modified in the top-bottom direction or the left-right direction is affixed by fastening to the connection hole 11B of the conductive bar 11 attached to the metal housing 3. After the affixing, the orientation of the output terminal VO can be modified in a desired orientation. The above configurations are only exemplary, and configurations including the output terminal VO of which the orientation and the like are modifiable may be implemented using various known technologies. The orientation of the input terminal X1 (the connection hole 11A) of FIG. 1 may also be modifiable similarly to the above-described output terminal VO (the connection hole 11B).

In the above-described embodiment, the tubular portion 21 may not be provided with the extension part 23 or the flange portion 25. In the above-described embodiment, the mold portion 37 may seal the upper surface of the substrates 51 and 52. While in the above-described embodiment only a part of the magnetic material core 35 is sealed by the mold portion 37, the magnetic material core 35 may be sealed as a whole so as to affix the magnetic material core 35 to the conductive bar 11. In the above-described embodiment, the filter module 1 may not include the packing 31. In the above-described embodiment, the filter module 1 may not include the ventilation hole 14 and the waterproof ventilation member 14A. The blocking unit 13 may include two or more ventilation holes 14. For example, the conductive bar 11 may generate Joule heat as the output signal (output voltage) is propagated therein. To address the heating, the number or inner diameter of the ventilation holes 14 may be increased. By thus introducing cooler outer air into the through hole 21A via the ventilation hole 14, it becomes possible to suppress changes in electronic characteristics due to a temperature increase in the chip capacitors 57 and the like. The ventilation hole 14 may not include the waterproof ventilation member 14A. The position at which the waterproof ventilation member 14A is disposed is an example. In other examples, the waterproof ventilation member 14A may be disposed at the opening of the ventilation hole 14. In the above-described embodiment, the filter module 1 is a π-type filter including the capacitors C0 and C1 connected at the ends of the choke coil L1. However, this is not a limitation, and, for example, the filter module may be an LC filter (L-type filter) only including the choke coil L1 and the capacitor C1. Alternatively, a filter having a separate configuration from the filter module 1, such as a T-type filter, may be used.

In the above-described embodiment an output voltage has been described as an example of the output signal transmitted through the conductive bar 11. However, the type of output signal is not limited to voltage. Also, the shape, number and the like of the members in the above-described embodiment are merely exemplary, and the shape and quantity may be modified as needed. For example, while in the above-described embodiment the flange portion 25 is disposed at the front end of the extension part 23, this is not a limitation and the flange portion 25 may be disposed at the center in the front-rear direction of the extension part 23. The shape and the like of the contact portion 61 in the above-described embodiment are also exemplary and may be modified as needed. The conductive bar 11 is not limited to a board-like member and may be, for example, a rod-shaped member. The magnetic material core 35 may not include the slits 35B.

The noise reduction device according to embodiments of the present disclosure may include the following first to seventh noise reduction devices.

The first noise reduction device is a noise reduction device that decreases noise that enters an output signal from an electronic device accommodated in a metal housing, the noise reduction device including: a conductive bar formed from a conductive material and transmitting the output signal; a magnetic material core formed from a magnetic material and disposed at surroundings of the conductive bar; a substrate adjacent to the magnetic material core and attached to the conductive bar; a metal tubular portion of a tubular shape including a through hole having the conductive bar penetrating therethrough and accommodating the magnetic material core and the substrate, with a screwed engagement part for screwed engagement with the metal housing provided at an outer peripheral portion of the metal tubular portion; a capacitor mounted on the substrate with one terminal connected to the conductive bar and another terminal connected to an inner wall of the through hole; and a blocking unit affixing the conductive bar with respect to the metal housing and the tubular portion so as to make an output terminal of an outer end of the conductive bar and blocking an opening of the through hole, wherein the magnetic material core, the substrate, and the capacitor are disposed in the through hole blocked by the blocking unit.

The second noise reduction device is the first noise reduction device wherein the tubular portion includes an extension part extending outwardly of the metal housing, and a flange portion protruding from the extension part toward the outside in a diameter direction of the tubular portion, the blocking unit being formed from a resin material and molding the extension part and the flange portion.

The third noise reduction device is the first or second noise reduction device wherein the tubular portion extends inward beyond the internally screwed engagement part of the metal housing with which the screwed engagement part is screwedly engaged.

The fourth noise reduction device is any one of the first to third noise reduction devices including a contact portion mounted on the substrate and elastically deformed by being held between the substrate and the inner wall of the through hole, the contact portion electrically connecting the other terminal of the capacitor to the inner wall by having a part of the contact portion contacting the inner wall.

The fifth noise reduction device is any one of the first to fourth noise reduction devices wherein the conductive bar has a board-like shape, the substrate is mounted on a planar portion of the conductive bar, and the one terminal of the capacitor is connected to the conductive bar on the planar portion of the conductive bar.

The sixth noise reduction device is any one of the first to fifth noise reduction devices provided with a mold portion formed from a resin material and affixing the position of the magnetic material core with respect to the conductive bar.

The seventh noise reduction device is any one of the first to sixth noise reduction devices wherein the blocking unit includes a ventilation hole providing communication between the inside of the through hole and the outside, and a waterproof ventilation member provided in the ventilation hole and having a ventilation property permitting the passage of gas and a waterproof property not permitting the passage of liquid.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A noise reduction device comprising:
a conductive bar of conductive material;
a magnetic material core of magnetic material disposed at surroundings of the conductive bar;
a substrate attached to the conductive bar so as to be adjacent to the magnetic material core;
a metal tubular portion with a through hole having the conductive bar penetrating therethrough and accommodating the magnetic material core and the substrate therein;
a capacitor mounted on the substrate and having a first terminal connected to the conductive bar and a second terminal connected to an inner wall of the through hole; and a blocking unit blocking an opening of the through hole so as to affix the conductive bar with respect to the metal housing and the tubular portion, wherein the tubular portion includes an outer peripheral surface having a screwed engagement part screwedly engaged with the metal housing, the magnetic material core, the substrate, and the capacitor are disposed in the through hole blocked by the blocking unit, and the conductive bar has an outer end that functions as an output terminal.

2. The noise reduction device according to claim 1, wherein
the tubular portion includes an extension part extending outwardly of the metal housing, and a flange portion protruding from the extension part outwardly in a diameter direction of the tubular portion, and the blocking unit is formed from a resin material and seals the extension part and the flange portion.

3. The noise reduction device according to claim 2, wherein the tubular portion extends into the metal housing beyond an internally screwed engagement part of the metal housing with which the screwed engagement part is screwedly engaged.

4. The noise reduction device according to claim 2, comprising a contact portion mounted on the substrate and elastically deformed by being held between the substrate and the inner wall of the through hole, the contact portion further including a portion contacting the inner wall, wherein the portion contacting the inner wall electrically connects the second terminal of the capacitor to the inner wall.

5. The noise reduction device according to claim 2, wherein:
the conductive bar has a board-like shape;
the substrate is mounted on a planar portion of the conductive bar, and
the first terminal of the capacitor is connected to the conductive bar on the planar portion thereof.

6. The noise reduction device according to claim 2, comprising a mold portion of resin material affixing the magnetic material core to the conductive bar.

7. The noise reduction device according to claim 2, wherein the blocking unit includes a ventilation hole providing communication between the inside of the through hole and the outside, and a waterproof ventilation member disposed in the ventilation hole and having a ventilation property and a waterproof property.

8. The noise reduction device according to claim 1, wherein the tubular portion extends into the metal housing beyond an internally screwed engagement part of the metal housing with which the screwed engagement part is screwedly engaged.

9. The noise reduction device according to claim 8, comprising a contact portion mounted on the substrate and elastically deformed by being held between the substrate and the inner wall of the through hole, the contact portion further including a portion contacting the inner wall, wherein the portion contacting the inner wall electrically connects the second terminal of the capacitor to the inner wall.

10. The noise reduction device according to claim 8, wherein:
the conductive bar has a board-like shape;
the substrate is mounted on a planar portion of the conductive bar, and
the first terminal of the capacitor is connected to the conductive bar on the planar portion thereof.

11. The noise reduction device according to claim 8, comprising a mold portion of resin material affixing the magnetic material core to the conductive bar.

12. The noise reduction device according to claim 8, wherein the blocking unit includes a ventilation hole providing communication between the inside of the through hole and the outside, and a waterproof ventilation member disposed in the ventilation hole and having a ventilation property and a waterproof property.

13. The noise reduction device according to claim 1, comprising a contact portion mounted on the substrate and elastically deformed by being held between the substrate and the inner wall of the through hole, the contact portion further including a portion contacting the inner wall, wherein the portion contacting the inner wall electrically connects the second terminal of the capacitor to the inner wall.

14. The noise reduction device according to claim 13, wherein:
the conductive bar has a board-like shape;
the substrate is mounted on a planar portion of the conductive bar; and
the first terminal of the capacitor is connected to the conductive bar on the planar portion thereof.

15. The noise reduction device according to claim 1, wherein:
the conductive bar has a board-like shape;
the substrate is mounted on a planar portion of the conductive bar; and
the first terminal of the capacitor is connected to the conductive bar on the planar portion thereof.

16. The noise reduction device according to claim 1, comprising a mold portion of resin material affixing the magnetic material core to the conductive bar.

17. The noise reduction device according to claim 1, wherein the blocking unit includes a ventilation hole providing communication between the inside of the through hole and the outside, and a waterproof ventilation member disposed in the ventilation hole and having a ventilation property and a waterproof property.

* * * * *